United States Patent
Yudanov et al.

(10) Patent No.: US 10,644,004 B2
(45) Date of Patent: May 5, 2020

(54) UTILIZING CAPACITORS INTEGRATED WITH MEMORY DEVICES FOR CHARGE DETECTION TO DETERMINE DRAM REFRESH

(71) Applicant: Advanced Micro Devices, Inc., Santa Clara, CA (US)

(72) Inventors: Dmitri Yudanov, Austin, TX (US); David A. Roberts, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/895,799

(22) Filed: Feb. 13, 2018

(65) Prior Publication Data
US 2019/0252385 A1    Aug. 15, 2019

(51) Int. Cl.
*G11C 7/00* (2006.01)
*H01L 27/108* (2006.01)
*G11C 11/408* (2006.01)
*G11C 11/406* (2006.01)

(52) U.S. Cl.
CPC ...... *H01L 27/10805* (2013.01); *G11C 11/406* (2013.01); *G11C 11/4085* (2013.01); *G11C 11/40611* (2013.01); *G11C 11/40615* (2013.01); *G11C 2211/4068* (2013.01)

(58) Field of Classification Search
CPC .............. G11C 11/40618; G11C 11/4068
USPC ........................................................ 365/149
See application file for complete search history.

(56) References Cited

U.S. PATENT DOCUMENTS

| | | | | |
|---|---|---|---|---|
| 5,796,671 A | * | 8/1998 | Wahlstrom | G11C 11/405 257/E21.396 |
| 9,336,855 B2 | * | 5/2016 | Lo | G11C 7/04 |
| 9,425,803 B1 | * | 8/2016 | Duncan | H03K 19/17768 |
| 2002/0018387 A1 | * | 2/2002 | Nam | G11C 11/406 365/222 |
| 2007/0268767 A1 | * | 11/2007 | Kim | G11C 7/04 365/222 |
| 2008/0056044 A1 | * | 3/2008 | Tomita | G11C 11/4074 365/222 |
| 2008/0165605 A1 | * | 7/2008 | Fisch | G11C 11/406 365/222 |
| 2018/0182449 A1 | * | 6/2018 | Kim | G11C 5/025 |

OTHER PUBLICATIONS

Kim, Y. et al., "A case for exploiting subarray-level parallelism (SALP) in DRAM," ACM SIGARCH Computer Architecture News, 40(3), 2012, pp. 368-379.

(Continued)

*Primary Examiner* — Huan Hoang
(74) *Attorney, Agent, or Firm* — Zagorin Cave LLP

(57) ABSTRACT

A modified 1C1T cell detects when the charge in the memory cell drops below a predetermined voltage due to leakage and asserts a refresh signal indicating that refresh needs to be performed on those memory cells associated with the modified 1C1T memory cell. The associated memory cells may be a row, a bank, or other groupings of memory cells. Because temperature affects leakage current, the modified memory cell automatically adjusts for temperature.

20 Claims, 6 Drawing Sheets

(56) References Cited

OTHER PUBLICATIONS

Liu, J. et al., "Retention-aware intelligent DRAM refresh," In ACM SIGARCH Computer Architecture News, vol. 40, No. 3, 2012, pp. 1-12.

Mukundan, J., et al., "Understanding and mitigating refresh overheads in high-density DDR4 DRAM systems," In ACM SIGARCH Computer Architecture News, vol. 41, No. 3, Jun. 2013, pp. 48-59.

Nair, P., et al., "A case for refresh pausing in DRAM memory systems," IEEE 19th International Symposium on High Performance Computer Architecture (HPCA2013), 2013, pp. 627-638.

Onuki, T. et al., "Fabrication of dynamic oxide semiconductor random access memory with 3.9 fF storage capacitance and greater than 1 h retention by using c-axis aligned crystalline oxide semiconductor transistor with L of 60 nm," Japanese Journal of Applied Physics, 54(4S), 2015, pp. 04DD07-1 to 04DD07-5.

Stan, M., "Breaking the 3D IC Power Delivery Walls Using Voltage Stacking," IEEE Computer Society Annual Symposium on VLSI, 2013, p. 212.

Stuecheli, J., et al., "Elastic refresh: Techniques to mitigate refresh penalties in high density memory," 43rd Annual IEEE/ACM International Symposium on Microarchitecture in Microarchitecture (MICRO), 2010, pp. 375-384.

Zhang, T. et al., "CREAM: A concurrent-refresh-aware DRAM memory architecture,", IEEE 20th International Symposium on in High Performance Computer Architecture (HPCA), Feb. 2014, pp. 368-379.

\* cited by examiner

UTILIZING CAPACITORS INTEGRATED WITH MEMORY DEVICES FOR CHARGE DETECTION TO DETERMINE DRAM REFRESH

BACKGROUND

Description of the Related Art

Modern processors use low-cost dynamic random access memory (DRAM) to meet large cache requirements. DRAM memories store their state as charge in a large array of one capacitor one transistor (1C1T) cells. Because the charge stored in the capacitor leaks over time, each cell has to be periodically refreshed to avoid loss of data. Refresh control has typically utilized counters to track which rows have been refreshed and timing logic to ensure each row is refreshed within a specified time limit to avoid data loss. However, the finer the granularity of the independent asynchronous refresh domain (rank, bank, row) the more counters are needed. In addition, temperature affects charge leakage and thus the timing of the refresh. Thus, thermal sensors monitor their temperature domains and complex logic adjusts the refresh rate in each domain based on measured temperature.

A typical refresh cycle takes hundreds of nanoseconds and thus impacts effective memory throughput and latency. Accordingly, if the frequency of refresh can be reduced, effective throughput and latency can be improved.

SUMMARY OF EMBODIMENTS OF THE INVENTION

Accordingly, in an embodiment a memory includes a modified memory cell that includes a capacitor coupled to be charged synchronously with a write to a plurality of memory cells associated with the modified memory cell. The modified memory cell is configured to assert a refresh signal based on a level of charge of the capacitor.

In another embodiment, a method includes charging a capacitor in a modified memory cell to a first voltage responsive to a word line of a memory being asserted. Responsive to a voltage across the capacitor dropping from the first voltage to below a second voltage, a refresh signal is asserted.

Another embodiment provides a memory that includes a modified memory cell for determining information related to refresh for a plurality of associated memory cells. The modified memory cell includes a capacitor for storing a charge corresponding to a retention time of the plurality of associated memory cells. Responsive to the charge on the capacitor being reduced due to leakage, a refresh signal is asserted by the modified memory cell thereby indicating the information related to refresh.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

In order to simplify DRAM refresh logic, embodiments utilize a modified 1C1T cell that detects charge leakage in the modified memory cell. When the charge in the memory cell drops below a predetermined voltage due to leakage, a refresh signal asserts indicating that refresh needs to be performed on those memory cells associated with the modified 1C1T memory cell. The associated memory cells may be a row, a bank, or other groupings of memory cells. Because temperature affects leakage current, the modified memory cell automatically adjusts for temperature and eliminates the need for temperature sensors. Because charge is directly measured, significant overhead of counters and other timing circuits and complex adjustments to refresh timing based on measured temperature can be avoided.

Figure 1:
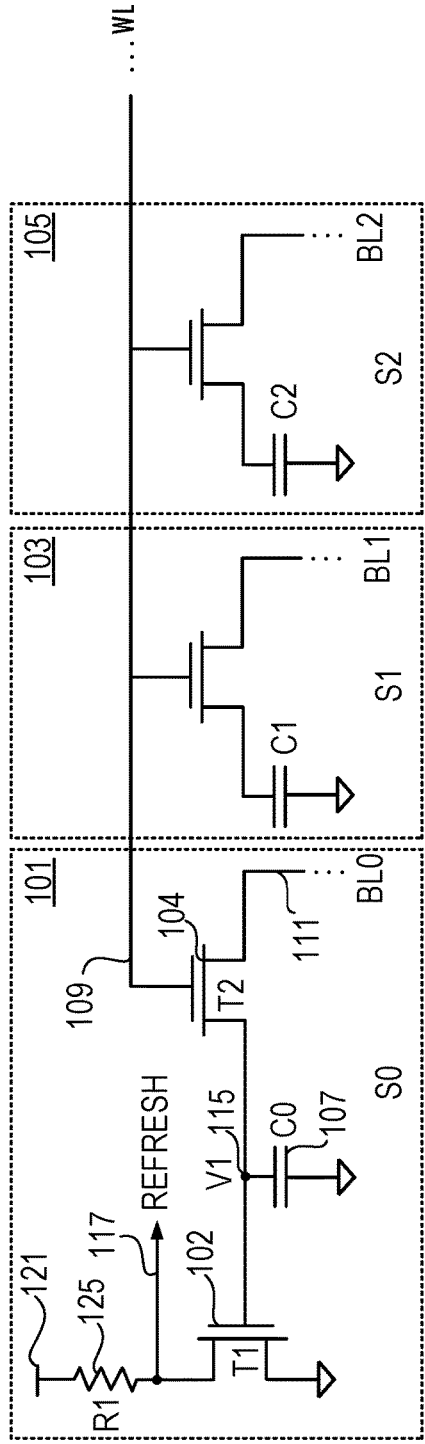
FIG. 1 illustrates an embodiment in which a modified 1C1T cell functions as a modified memory cell.

FIG. 1 illustrates an example of a modified 1C1T memory cell 101 (S1) that detects charge leakage to determine when refresh is needed for the row in which it is disposed. The row includes regular 1C1T memory cells 103 (S1) and 105 (S2). In the embodiment of FIG. 1, the modified memory cell 101 includes an NMOS transistor 102 (T1) and an access transistor 104 (T2). The capacitor 107 (C0) stores charge supplied through transistor 104 and corresponds to the capacitors C1 and C2 in regular memory cells 103 and 105. The gate of transistor 104 receives word line 109 and one current carrying node of the transistor 104 is coupled to a bit line 111 and another current carrying node of the transistor 104 supplies capacitor 107. With the word line 109 asserted, bit line 111 charges the capacitor. The capacitor 107 (C0) is charged anytime a value is stored to the row, i.e., anytime wordline (WL) 109 is asserted and data is transferred from the row buffer (not shown) to the memory row. Thus, charging of the capacitor 107 (C0) is synchronized with a write operation to the row, which determines when to start determining leakage for that specific row. Note that if the memory restores a row right after a destructive read, then that restore charges the capacitor and determines when to start determining leakage for that row.

In the embodiment illustrated in FIG. 1, the modified memory cell detects when the charge in capacitor C0 drops below a predetermined level causing the refresh signal 117 to assert. When fully charged, the voltage V1 at node 115 keeps transistor 102 turned on, which pulls the refresh signal line 117 towards ground. The charge on the capacitor gradually diminishes through leakage. As the voltage V1 at node 115 decreases, eventually the voltage V1 crosses below the threshold voltage of transistor 102 shutting off transistor 102 and the power supply node 121 pulls the refresh signal line towards the power supply voltage through resistance R1 125, thus asserting the refresh signal line 117 indicating that a refresh needs to be performed.

Figure 2:
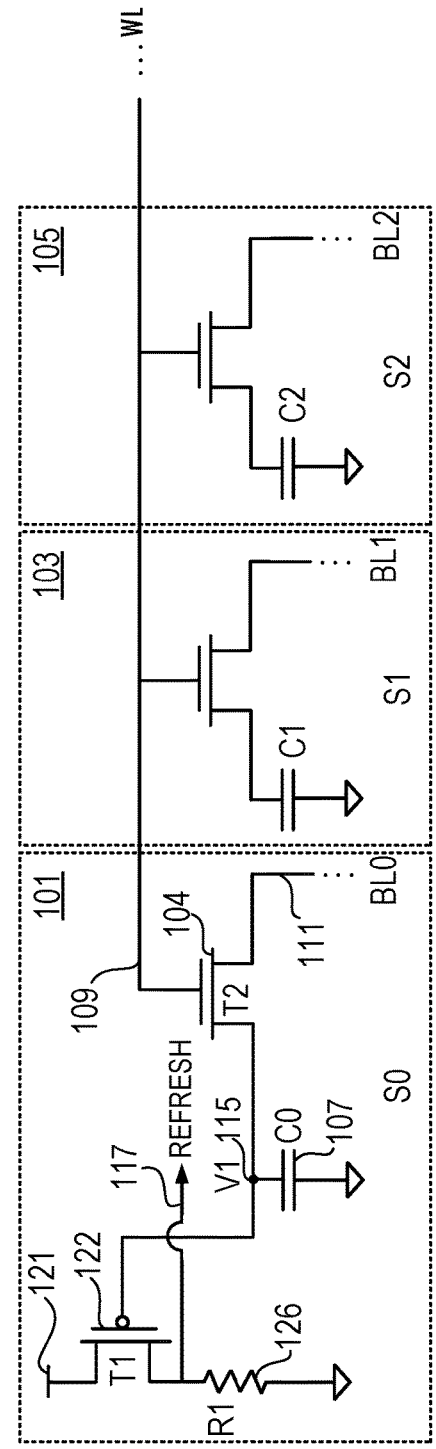
FIG. 2 illustrates another embodiment in which a modified 1C1T cell functions as a modified memory cell that uses a PMOS transistor.

FIG. 2 illustrates an embodiment where transistor T1 is a PMOS transistor 122. In such an embodiment, when fully charged, the voltage on node V1 keeps transistor 122 off and the refresh voltage node is pulled towards ground through resistor 126. When the capacitor leaks sufficient charge, the voltage at node 115 drops so as to turn on transistor 122 to pull the refresh signal 117 towards the power supply 121. Of course, many other circuit configurations would be known to those of skill in the art to assert the refresh signal based on the charge at node 115 dropping due to leakage.

The temperature affects the amount of leakage current, thus each modified memory cell is directly affected by temperature. Thus, as charge leakage increases due to a higher temperature, the refresh signal line asserts more quickly and when leakage decreases due to a temperature drop, the refresh signal line asserts more slowly. That avoids the need for temperature sensors and the need to adjust refresh timing counters based on detected temperature.

Figure 3:
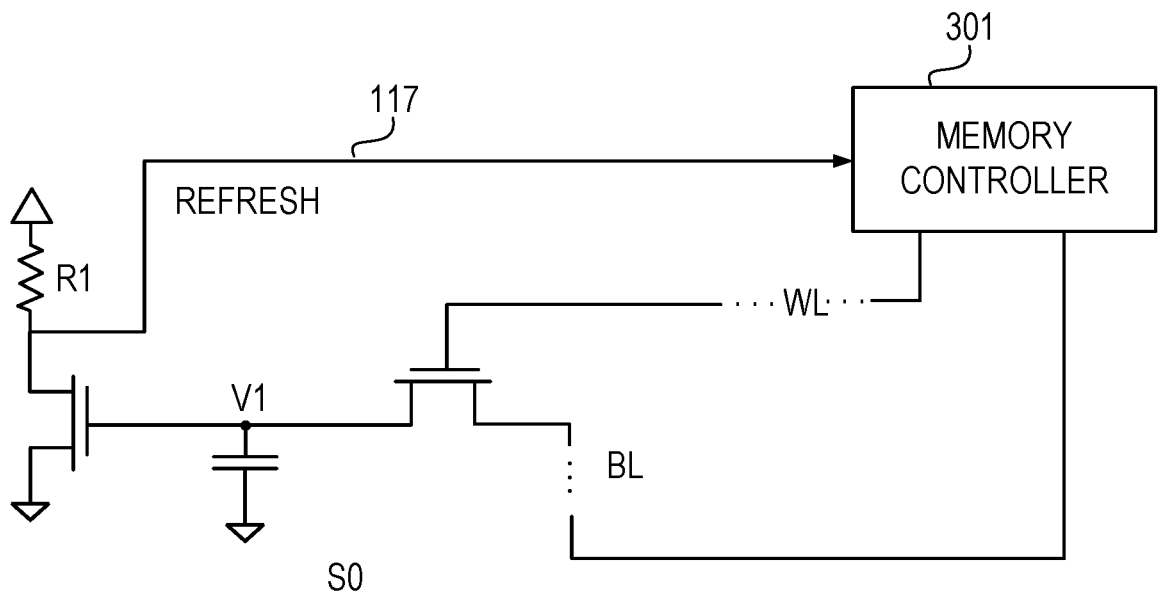
FIG. 3 illustrates a modified memory cell coupled to a memory controller.

Rather asserting the refresh signal at a charge level that corresponds to a single retention time, embodiments utilize modified memory cells providing alerts corresponding to different retention times (e.g., different fractions of the retention time). The retention time refers to the amount of time that the capacitor (e.g., C1 and C2) will hold the charge corresponding to the state of the memory cell. For example, a refresh alert can be selected that is associated with one half of the retention time having elapsed indicating that a refresh will be coming due but is not yet critical. A second refresh alert may be associated with three quarters of the retention time having elapsed indicating a refresh will be due soon. A third refresh alert may be associated with nine tenths of the retention time having elapsed indicating a refresh is critically needed or otherwise the state of the memory cell will be lost. As shown in FIG. 3 the memory controller 301 receives the refresh signal line 117 from the modified memory cell. If there are multiple modified memory cells for a particular row or other group of memory cells, e.g., to provide different retention time indications, then in an embodiment the refresh signal from each modified memory cell is supplied to the memory controller 301. While FIG. 3 shows a modified memory cell, the memory controller 301 receives refresh alerts from refresh signal lines of other modified memory cells. The memory controller controls reading and writing to the memory cells using the word lines and bit lines. Using modified memory cells with different retention times for the same row or block of memory allows the memory controller to have more precise control over memory. The refresh occurs conventionally by writing back the contents of the memory cells. The modified memory cell S0 may be charged by writing a high voltage to the cell.

The modified memory cell can be calibrated with known techniques for adjusting resistance R1 and/or capacitance C0 and/or transistor T1 to achieve desired retention timing. For example, in embodiments, referring to FIGS. 1 and 2, the resistance R1 125 (126) and capacitance C1 107 are variable and are tuned to provide the desired retention timing. In addition, transistors with different threshold voltages can be utilized in the modified memory cell. An appropriate transistor can be selected according to the desired retention timing. For example, with a lower resistance 125, the refresh signal will assert more quickly in response to a particular voltage V1 at node 115. Use of a smaller capacitor C0 and a transistor 102 with a higher threshold voltage can cause the refresh signal to assert earlier as the charge leakage drains smaller charge faster degrading the gate-source voltage of transistor T1 more quickly. Note that while shown as a single capacitor, capacitor 107 may be formed of multiple parallel capacitors, particularly in embodiments where the capacitor is programmable. In addition, the resistance R1 may be formed of multiple resistors, particularly in embodiments where the resistor R1 is programmable.

In embodiments multiple T1 transistors in parallel, with different threshold voltages, can be driven with the capacitor C0 since the gates of the transistors provide a high impedance connection with the capacitor thereby providing greater flexibility for the modified memory cell. For example, one of the transistors can be selected as the best transistor through manufacturing testing and the remaining transistors can be fused off. However, the more transistor gates added to node 115 the bigger the parasitic capacitance. Part of the added parasitic capacitance can be offset by a smaller C0. In general, a plurality of T1 transistors can be connected to a plurality of C0s. Each C0 can be formed from multiple parallel capacitors and each of the capacitors could even have its own access transistor. That would allow calibration and tuning of the modified memory cell by fusing on or off the multiple capacitances.

Figure 4:
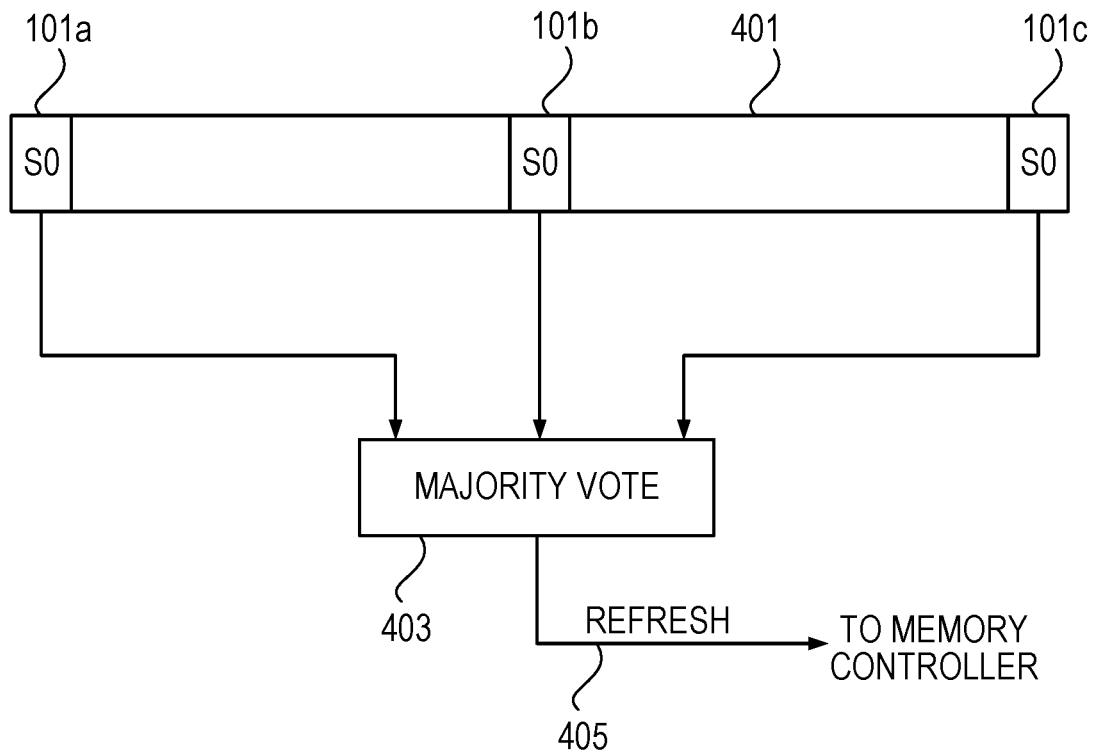
FIG. 4 illustrates an embodiment with multiple modified memory cells in a memory row and use of a voting scheme.

In an embodiment, each memory row includes one or more modified memory cells to detect voltage change due to charge leakage, thereby providing refresh at row granularity. When the row is refreshed or stored the capacitor(s) in the modified memory cell(s) associated with that row are charged to a high voltage. FIG. 4 illustrates an embodiment with modified memory cells 101a, 101b, 101c disposed in a single row or other refresh region 401 to achieve better detection, redundancy, and/or allow utilization of a voting scheme (e.g. majority vote). Using multiple modified memory cells also allows hot spots along the row to be detected. For a voting scheme, a voting circuit 403 receives the refresh signals 117a, 117b, 117c and the voting circuit asserts the refresh signal 405 if a majority of the refresh signals 117a, 117b, and 117c are asserted. The particular voting scheme may be a simple majority voting scheme or a more complex voting scheme, e.g., where particular refresh signals may be more heavily weighted than other refresh signals. For example, voting circuit 403 may assert the refresh signal 405 if any of the refresh signals indicate a critical charge level has been reached (e.g., 90% of the retention time has elapsed) thereby avoiding data loss.

Figure 5:
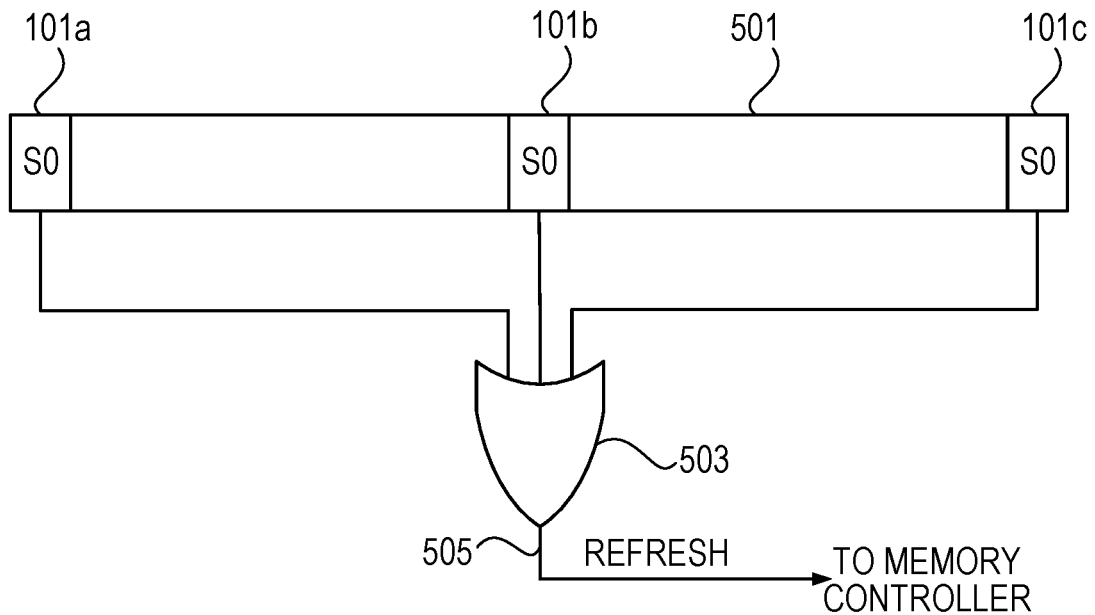
FIG. 5 illustrates an embodiment with multiple modified memory cells in a refresh region in which one of the outputs of the multiple modified memory cells are ORed together.

Alternatively, as shown in FIG. 5, the various refresh signals for refresh region 501 may be logically ORed together in OR gate 503 and supplied as combined refresh signal 505 so if any of the refresh signals from any of the modified memory cells assert, the memory controller refreshes the row (or other memory area) associated with the modified memory cells. That provides redundancy in case one of the modified memory cells fails or is at a significantly different temperature than another modified memory cell in the row.

Figure 6:
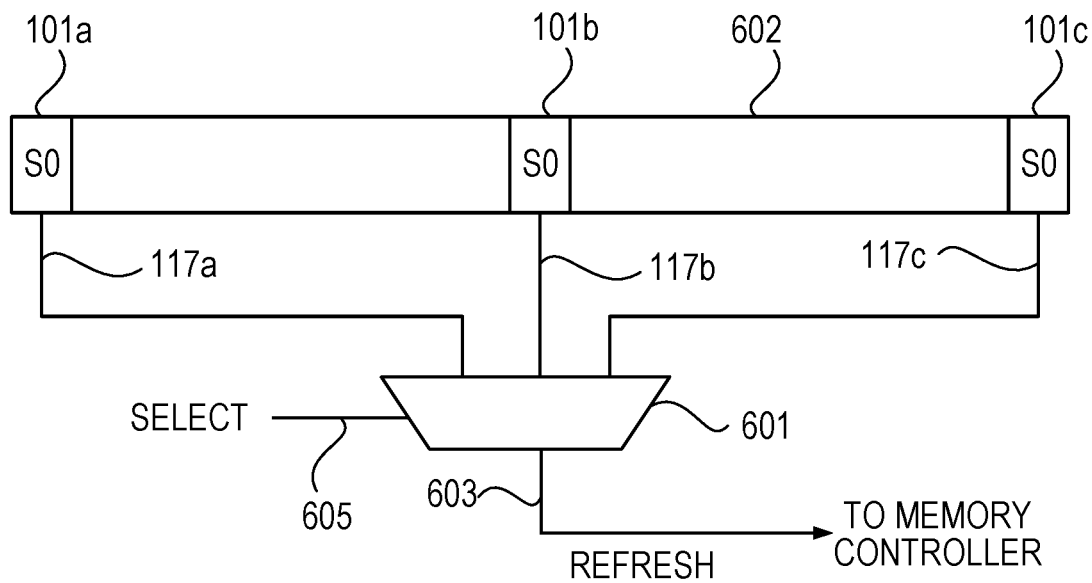
FIG. 6 illustrates an embodiment with multiple modified memory cells in a refresh region in which the output of one of the modified memory cells is selected as the refresh signal.

FIG. 6 shows an embodiment where multiplexer 601 selects one of multiple modified memory cells for a refresh region 602, e.g., a row of memory, to provide the refresh signal 603. Each modified memory cell may have a transistor T1 (see FIG. 1) with a different threshold voltage, a different resistance 125, and/or a different capacitance C0. The most accurate modified memory cell is chosen during manufacturing testing, which determines the value of the select line(s) 605 that selects the desired modified memory cell. The value of the select line may be fused during the manufacturing testing or otherwise stored in nonvolatile memory.

Figure 7:
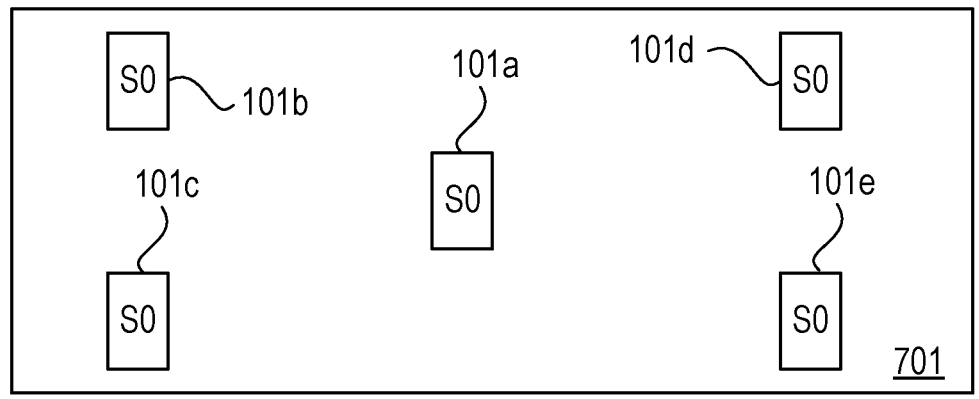
FIG. 7 illustrates an embodiment with multiple modified memory cells for a block of memory.

While embodiments may provide row granularity, other embodiments, such as illustrated in FIG. 7, utilize one or more modified memory cells 101a, 101b, 101c, 101d, 101e distributed through a refresh region such as a memory block 701. The block may be sized in any way appropriate to the particular application. If a single modified memory cell 101a is utilized, the memory controller refreshes the memory block 701 when the modified memory cell asserts the refresh signal. Where multiple modified memory cells are used in the memory block, a voting scheme may be used as shown in FIG. 4, a logical OR of the refresh signals as shown in FIG. 5, or a selection of one of the modified memory cells as shown in FIG. 6, or any suitable logical combination of the refresh signals.

Figure 8:
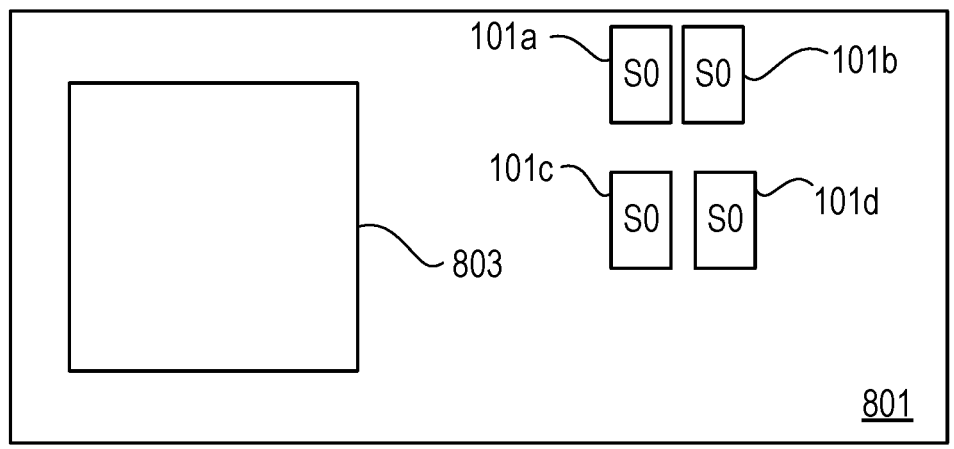
FIG. 8 illustrates multiple modified memory cells decoupled from an associated block of memory.

While some embodiments incorporate the modified memory cells into the row or memory block associated with the modified memory cells, other embodiments decouple the modified memory cell from the memory row or block associated. Thus, referring to FIG. 8, modified memory cells 101a, 101b, 101c, and 101d are disposed in integrated circuit 801 and associated with memory block 803 but are physically decoupled from the memory block. The charging of the capacitors of the modified memory cells remains synchronized with the writing or refresh of the associated memory cells.

Figure 9:
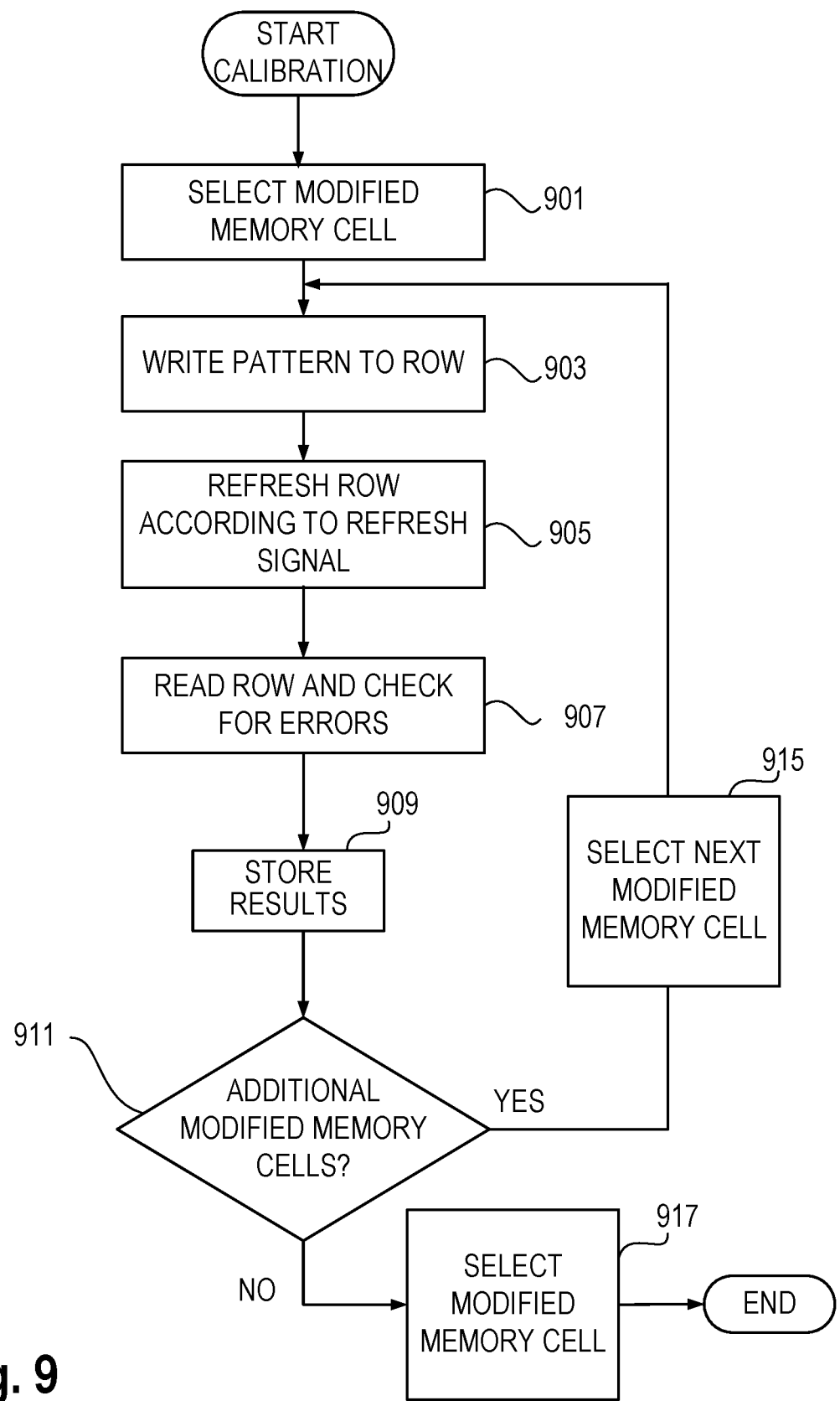
FIG. 9 illustrates a flow diagram illustrating an embodiment for training to select a modified memory cell.

FIG. 9 shows an example flow diagram for selecting one of multiple modified memory cells as the most accurate modified memory cell during manufacturing testing. The testing operation may be controlled from the memory controller or externally through the memory controller. Step 901 selects the modified memory cell. For example, the step 901 selects one of the three modified memory cells shown in FIG. 6. The test operation in 903 writes a pattern to the refresh region being tested, e.g., a memory row. The row is refreshed based on the refresh signal in 905 and the row is read out and checked for errors in 907. The test results are stored in 909 and a check is made in 911 to determine if there are additional modified memory cells to test. If so, the next modified memory cell is selected in 915 and the test flow returns to 903 so the memory row (or other refresh region) can be written, refreshed, read, and checked for satisfactory refresh operation. Once all modified memory cells have been tested, the most accurate modified memory cell is chosen. That may be based, e.g., one or more of factors such as successful refresh operation (without errors), on the closeness of the modified memory cell operation to detection of a preferred threshold of charge, e.g., 50%. The most accurate modified memory cell is chosen in 917 and if none of the modified memory cells are satisfactory, the operation in 917 indicates a failure. In addition, for embodiments where modified memory cells provide alerts corresponding to different retention times, the modified memory cells may be chosen as most accurately reflecting, e.g., 50% of the retention time elapsed, 75% of the retention time elapsed, and 90% of the retention time elapsed.

Figure 10:
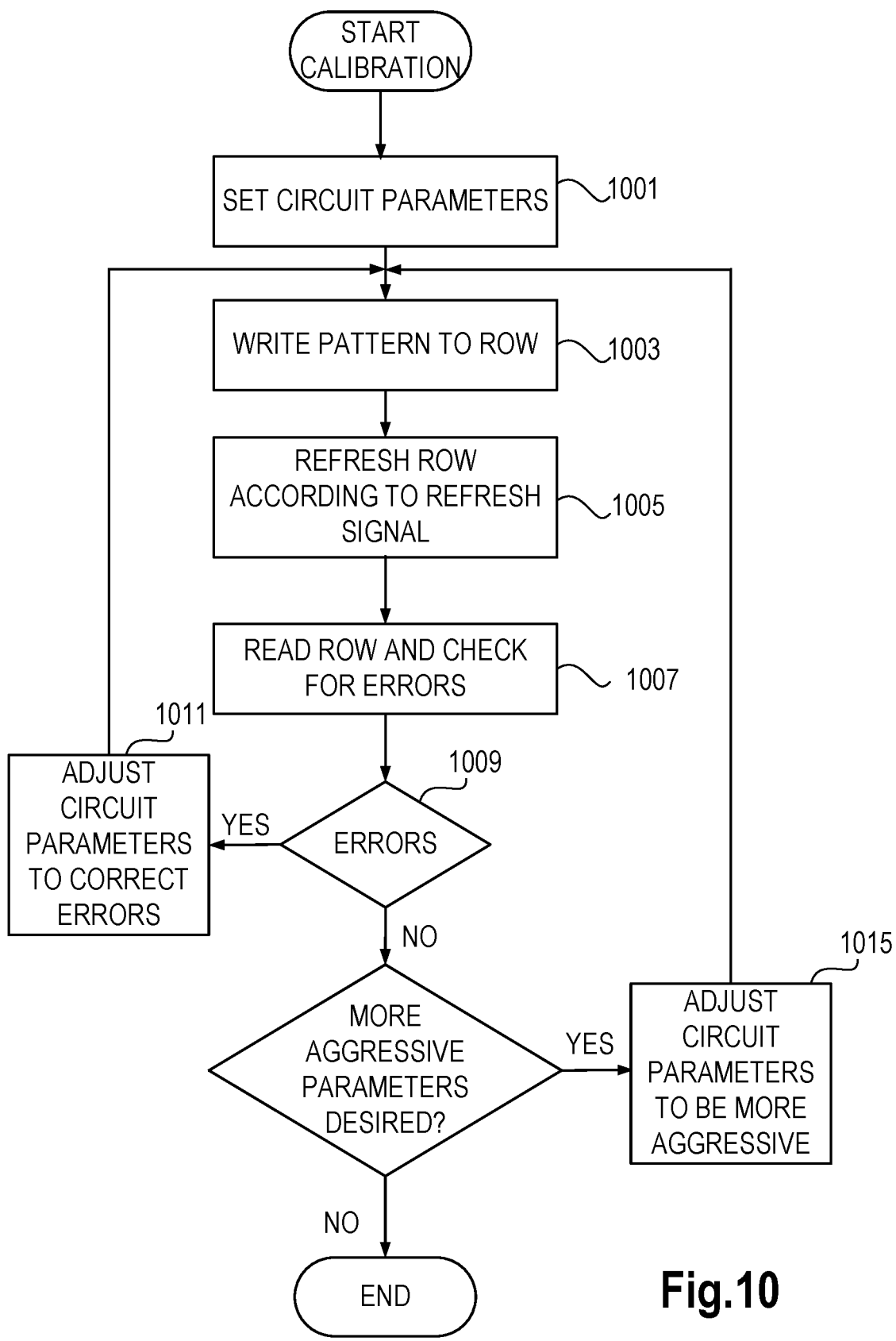
FIG. 10 illustrates a flow diagram illustrating an embodiment for training to adjust parameters of the modified memory cell.

FIG. 10 illustrates an example of a calibration operation. Assume a single modified memory cell is present in each row and that one or more of the modified memory cell parameters such as the capacitance 107 and the resistance 125 (see FIG. 1) can be adjusted to adjust when the refresh signal 117 asserts. The calibration may be controlled from the memory controller or externally through the memory controller. The calibration operation in 1001 sets the circuit parameters for capacitance 107 and/or the resistance 125.

The calibration operation in 1003 writes a pattern to one or more memory rows. The row is refreshed based on the refresh signal in 1005 and the row is read out and checked for errors in 1007. If there are errors in 1009, indicating that the refresh operation did not occur in time, the circuit parameters of the modified memory cell are adjusted in 1011 to cause the refresh signal to assert more quickly. If instead the error check indicates no errors, the modified memory cell parameters may be left in place or made more aggressive in 1015 in terms of asserting the refresh signal closer to the time at which loss of data occurs to ensure that refresh operations are not performed too early and throughput is maximized. In that case, the flow returns to 1003 so the memory row can be written, refreshed, read, and checked for satisfactory operation. The parameters may be adjusted until an error occurs in which case the parameters may be backed off to be less aggressive or the circuit parameters are deemed satisfactory. In addition, for embodiments where modified memory cells provide alerts corresponding to different retention times, the circuit parameters may be adjusted so that the retention times are calibrated to accurately reflect, e.g., 50%, 20%, and 10% retention times.

Thus, embodiments have been described for modified memory cells that detect when leakage from capacitors storing the state of memory cells has progressed to the extent that refresh is required. The description set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A memory comprising:
   a memory cell of a first type including,
      a capacitor coupled to be charged synchronously with a write operation to a row of a plurality of memory cells of a second type that are associated with the memory cell;
      a first transistor coupled between a refresh signal node, which supplies a refresh signal to control refresh of the plurality of memory cells of the second type, and a power supply node, the first transistor having a gate coupled to a node of the capacitor and a current carrying node coupled to the refresh signal node; and
      the memory cell configured to assert the refresh signal based on a level of charge of the capacitor.

2. The memory as recited in claim 1 wherein the memory cell further comprises:
   an access transistor having a gate coupled to a word line of the memory, a first current carrying node of the access transistor being coupled to a bit line of the memory and a second current carrying node of the access transistor coupled to the node of the capacitor and the gate of the first transistor.

3. The memory as recited in claim 1 wherein the memory cell comprises:
   a resistance coupled between a second power supply node and the refresh signal node supplying the refresh signal; and
   wherein responsive to a voltage on the capacitor being below a predetermined voltage level, the refresh signal node is asserted.

4. The memory, as recited in claim 3, wherein responsive to the voltage on the capacitor being below the predetermined voltage level, the first transistor is turned off and the refresh signal node is pulled towards a power supply voltage level of the second power supply node.

5. The memory as recited in claim 1 wherein the refresh of the plurality of memory cells of the second type associated with the memory cell is determined according to a value of the refresh signal.

6. The memory as recited in claim 1 wherein each row of the memory has at least one memory cell of the first type disposed therein.

7. The memory as recited in claim 1 wherein the memory cell determines, at least in part, refresh for a plurality of rows of memory cells.

8. The memory as recited in claim 1 further comprising:
a plurality of memory cells of the first type including the memory cell, at least some of the plurality of memory cells of the first type being associated with a different charge retention time than others of the plurality of memory cells of the first type.

9. The memory as recited in claim 1 wherein the second type is a one capacitor one transistor (1C1T) memory cell.

10. The memory as recited in claim 1 wherein the memory cell further comprises:
a resistance coupled between a second power supply node and the refresh signal node supplying the refresh signal, the second power supply node being a ground node; and
wherein responsive to a voltage on the capacitor being below a predetermined voltage level, the first transistor is turned on thereby coupling the refresh signal node to the power supply node and causing the refresh signal node to be asserted.

11. A memory comprising:
a memory cell of a first type including,
    a capacitor coupled to be charged synchronously responsive to a wordline of a plurality of memory cells of a second type that are associated with the memory cell being asserted;
    a first transistor coupled between a refresh signal node, which supplies a refresh signal to control refresh of the memory cells of the second type, and a power supply node, the first transistor having a gate coupled to a node of the capacitor and a current carrying node coupled to the refresh signal node; and
    the memory cell configured to assert the refresh signal based on a level of charge of the capacitor;
a plurality of memory cells of the first type including the memory cell;
a voting circuit coupled to respective refresh signals of the plurality of memory cells of the first type; and
wherein the voting circuit is coupled to assert a combined refresh signal based on the respective refresh signals.

12. The memory as recited in claim 11 wherein if any of the respective refresh signals indicate a critical refresh level, the voting circuit asserts the combined refresh signal.

13. A method comprising:
charging a capacitor in a memory cell of a first type to a first voltage responsive to a word line of a memory being asserted;
supplying a voltage from the capacitor to a gate of a first transistor coupled between a refresh signal node and a power supply node, the refresh signal node supplying a refresh signal; and
responsive to the voltage across the capacitor dropping from the first voltage to below a second voltage changing a state of the first transistor to thereby cause the refresh signal to be asserted.

14. The method as recited in claim 13 further comprising:
refreshing a plurality of memory cells of a second type associated with the refresh signal responsive to assertion of the refresh signal.

15. The method as recited in claim 14 further comprising providing different indications of retention time for the plurality of memory cells using a plurality of memory cells of the first type, at least some of the plurality of memory cells of the first type associated with a different charge retention time.

16. The method as recited in claim 13 further comprising:
turning on a second transistor responsive to the word line being asserted;
setting a bit line coupled to a first current carrying node of the second transistor to a voltage level sufficient to charge the capacitor; and
charging the capacitor through a second current carrying node of the second transistor with the word line asserted and the bit line set at the voltage level sufficient to charge the capacitor.

17. The method as recited in claim 13 further comprising:
writing a pattern to a plurality of memory cells associated with the refresh signal;
refreshing the plurality of memory cells responsive to the refresh signal being asserted;
reading the plurality of memory cells and comparing first read values to the pattern to determine if an error occurred; and
adjusting a timing associated with asserting the refresh signal responsive to the error.

18. The method as recited in claim 13 further comprising:
selecting one of a plurality of memory cells of the first type as the memory cell according to testing operations of the plurality of memory cells of the first type.

19. The method as recited in claim 13 further comprising:
logically combining respective refresh signals from a plurality of memory cells of the first type, the plurality of memory cells of the first type including the memory cell and supplying a combined refresh signal; and
refreshing a plurality of memory cells responsive to assertion of the combined refresh signal.

20. The method as recited in claim 13 further comprising changing the state of the first transistor from on to off to cause the refresh signal node to be asserted.

* * * * *